US005627499A

United States Patent [19]
Gardner

[11] Patent Number: 5,627,499
[45] Date of Patent: May 6, 1997

[54] DIGITAL MODULATOR AND UPCONVERTER HAVING SINGLE-BIT DELTA-SIGMA DATA CONVERTERS

[75] Inventor: Steven H. Gardner, San Diego, Calif.

[73] Assignee: Pacific Communication Sciences, Inc., San Diego, Calif.

[21] Appl. No.: 542,808

[22] Filed: Oct. 13, 1995

[51] Int. Cl.[6] .............................. H03C 3/00; H04L 27/12
[52] U.S. Cl. ........................ 332/101; 375/274; 375/305
[58] Field of Search ........................... 332/100–105; 375/271–274, 279, 303, 305, 308

[56] References Cited

U.S. PATENT DOCUMENTS 5,155,454  10/1992  Amoroso ................................. 332/100
5,434,888   7/1995  Fukuchi ............................... 332/100 X

OTHER PUBLICATIONS

"Oversampling methods for A/D and D/A Conversion", James C. Candy and Gabor C. Temes, *IEEE* 1992, pp. 1–19, 1992 no month.

*Primary Examiner*—David Mis
*Attorney, Agent, or Firm*—Merle W. Richman, III; Martin J. Jaquez

[57] ABSTRACT

A method and apparatus for digitally phase modulating and frequency upconverting communication signals to an intermediate frequency, producing the IF output with only digital hardware and without the use of digital to analog converters, analog multipliers (mixers) or power combiners. A digital phase modulator provides an in-phase and a quadrature output, each of which is coupled to one input of a relatively simple multi-bit to single-bit delta-sigma data converter. The output from the converter is a pair of single-bit digital output signals. Each such single-bit output is inverted and both the inverted single-bit output and the non-inverted single-bit output of both the in-phase and the quadrature outputs are coupled to a 4:1 multiplexer. One of these four inputs is then selected by a modulo-4 counter. The modulo-4 counter is incremented at a rate that is selected based upon the desired IF frequency.

10 Claims, 2 Drawing Sheets

DIGITAL MODULATOR AND UPCONVERTER HAVING SINGLE-BIT DELTA-SIGMA DATA CONVERTERS

BACKGROUND OF THE INVENTION

1. Field of the Invention

This invention relates to communications equipment, and more particularly to a method and apparatus for modulating and upconverting to an intermediate frequency electronic signals which represent data symbols.

2. Description of Related Art

Modulation and upconversion of signal are well known in the electronic communication arts. That is, when information is to be transmitted by radio waves, it is common to first modulate a baseband signal with the information to be transmitted and then to upconvert the information from the baseband frequency to an intermediate frequency. Typically the Intermediate Frequency (IF) is then further upconverted to a Radio Frequency (RF) signal for transmission.

The use of an IF frequency in the transmitting of a low cost, small mobile communications terminal is often very desirable by comparison to the alternative of converting directly from the baseband frequency to the transmitter RF frequency. For example, in many mobile or cellular communication devices, communication is full duplex, so that a receiver is operating at the same time as a transmitter. To save parts (and thus power and cost) it is a common practice to use the same synthesizer to provide the Local Oscillator (LO) frequency for both the receiver and the transmitter. But a difficult problem that occurs when direct upconversion is used is that the transmitted signal, which is at a high power level, is at the same frequency as a Voltage Controlled Oscillator (VCO) output in the synthesizer. It is very difficult to provide adequate isolation between the high power transmitter output signal and the VCO to prevent degradation of the synthesizer phase noise performance by the transmitter output. This phase noise degradation results in poor receiver performance.

To prevent this, it is common in the art to use a dual conversion transmitter in which the baseband signal is converted to an IF frequency using a fixed LO, and then a tunable synthesizer is used to upconvert the signal to the selected RF channel. The synthesizer output is offset from the desired transmitter RF frequency by an amount equal to the IF frequency, so the phase noise induced by the transmitter output can easily be removed using a bandpass filter before the synthesizer output is used in the receiver.

A common problem with dual upconversion approaches is that there are many frequency products generated in the second mixer where the IF and synthesizer LO are mixed, and these can fall in the transmitter passband where they can not be easily removed by filtering. It can be shown that in many applications (including cellular voice) when the RF and IF differ by a factor on the order of ten, the unwanted mixer products tend to be spaced sufficiently distant from the desired signal that the most significant products can be readily removed by filtering. Thus, use of an IF frequency of 90 MHz is a very common and desirable approach for cellular applications where the RF frequency is between 800 and 900 MHz.

In accordance with one method for modulating information onto a baseband signal, the phase of an output signal is modulated with a data input signal by a phase modulator. The phase modulator output is equal to $s(t) = \cos \phi(t) \cos 2\pi f_c t - \sin \phi(t) \sin 2\pi f_c t = 2 \cos(2\pi f_c t + \phi(t))$. The frequency $f_c$ may be either the RF carrier frequency or an intermediate carrier frequency. For the reasons stated above, the frequency $f_c$ is typically an IF frequency and a second conversion is performed to upconvert the output to the RF frequency.

Typically, the output of such a phase modulation scheme is derived from an in-phase component and a quadrature component which are summed at a summing point. For example, FIG. 1 is a simplified block diagram of a common implementation of a GMSK modulator. A digital data input $a_k$ to the modulator is applied via signal line 101 to a GMSK waveform lookup table device 103. The GMSK lookup table device 103 converts the input data into a pair of waveforms, which taken together reflect the state of the last x input data states (where x typically is 3 for binary GMSK with BT=0.5 and modulation index 0.5). A first one of these waveforms is output on signal line 105 and is essentially a digital representation of $\cos \phi(t)$, where $\phi(t)$ is a phase waveform depending on the input data bit stream. A second one of these waveforms is output on signal line 107 and is essentially a digital representation of $\sin \phi(t)$. These waveforms are then each converted into analog format by a pair of conventional digital to analog converters (DACs) 109. The analog outputs from the two DACs 109 are coupled to two lowpass filters 111. The lowpass filters remove alias energy present at multiples of the sampling frequency that results from the sampling process.

The outputs from each lowpass filter 111 are coupled to a multiplier circuit (such as a mixer) 113 which frequency upconverts the inputs to the IF frequency by multiplying the input by a factor of $\cos 2\pi f_c t$ or $\sin 2\pi f_c t$. Accordingly, an input signal equal to $\cos 2\pi f_c t$ is coupled to the second input to mixer 113a (i.e., the mixer associated with the in-phase component, i.e., the $\cos \phi(t)$ term). Therefore, the output from the in-phase component mixer 113a is equal to $\cos \phi(t) \cos 2\pi f_c t$. Likewise, an input equal to $\sin 2\pi f_c t$ is coupled to the second input to the quadrature component mixer 113b and multiplied with a signal equal to $\sin \phi(t)$. Therefore, the output of the quadrature component mixer 113b is equal to $\sin \phi(t) \sin 2\pi f_c t$. By coupling the in-phase and quadrature components to the positive and negative inputs to a summing circuit 115, the output from the summing circuit 115 is the modulated output $s(t) = \cos \phi(t) \cos 2\pi f_c t - \sin \phi(t) \sin 2\pi f_c t$. This output is typically frequency upconverted one more time to the required RF frequency. The RF upconverter is not shown.

One problem associated with such modulation schemes is that a relatively large number of analog components must be used. That is, there is a need for two DAC circuits, two analog lowpass filters, two analog multipliers, and an analog adder. It should be clear that a method and apparatus for modulating and upconverting the signal output from a modulator to provide an output equal to $\cos \phi(t) \cos 2\pi f_c t - \sin \phi(t) \sin 2\pi f_c t$ without the need for all of the components which are presently required would be desirable. This is because these components require additional space and power, and increase the cost of the system. In small portable communication devices, size, cost and power consumption are of great importance.

SUMMARY OF THE INVENTION

The present invention is a method and apparatus for digitally phase modulating and frequency upconverting communication signals to an intermediate frequency, producing an IF output with only digital hardware and without the use of digital to analog converters, analog multipliers (mixers) or power combiners. The present invention is suitable for use in digital application specific integrated circuits (ASICs) which can be produced in relatively small size and which consume relatively little power. Since an ASIC is often present to perform other digital signal processing functions, and since the complexity of the proposed invention is small, the addition of the present invention to the existing ASIC often can be accomplished with no added size or per unit cost whatsoever. In this case, the size and cost of the analog circuits previously described can be completely eliminated.

In accordance with the present invention, a digital phase modulator provides an in-phase and a quadrature output, each of which is coupled to one input of a relatively simple single-bit delta-sigma data converter (DDC). The output from the single-bit DDC is a pair of signal-bit digital output signals. Each such single-bit output is inverted. Both the inverted single-bit output and the non-inverted single-bit output of the in-phase and the quadrature outputs are coupled to a 4:1 multiplexer. Each of these four inputs is then cyclically selected by a modulo-4 counter. The modulo-4 counter is incremented at a rate that is selected based upon the desired IF frequency.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers are used in each Figure to designate like elements.

DETAILED DESCRIPTION OF THE INVENTION

Throughout this description, the preferred embodiment and examples shown should be considered as exemplars, rather than limitations on the present invention.

The present invention is a digital phase modulator and IF upconverter which does not require a delta-sigma data converter (DDC), analog lowpass filters for alias removal, analog multipliers (e.g., mixers), or an analog adder.

Figure 1:
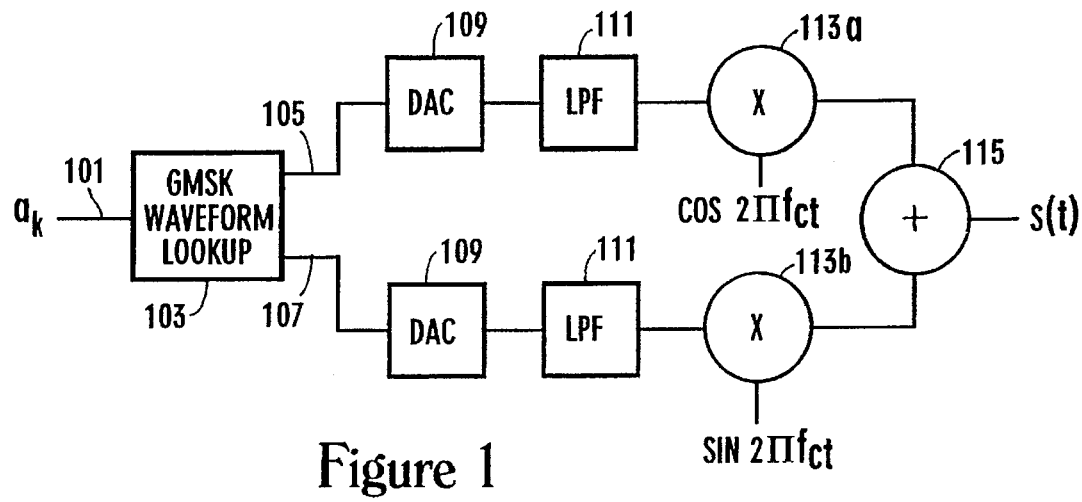
FIG. 1 is a simplified block diagram of a prior art modulator and upconverter assembly.
Figure 2:
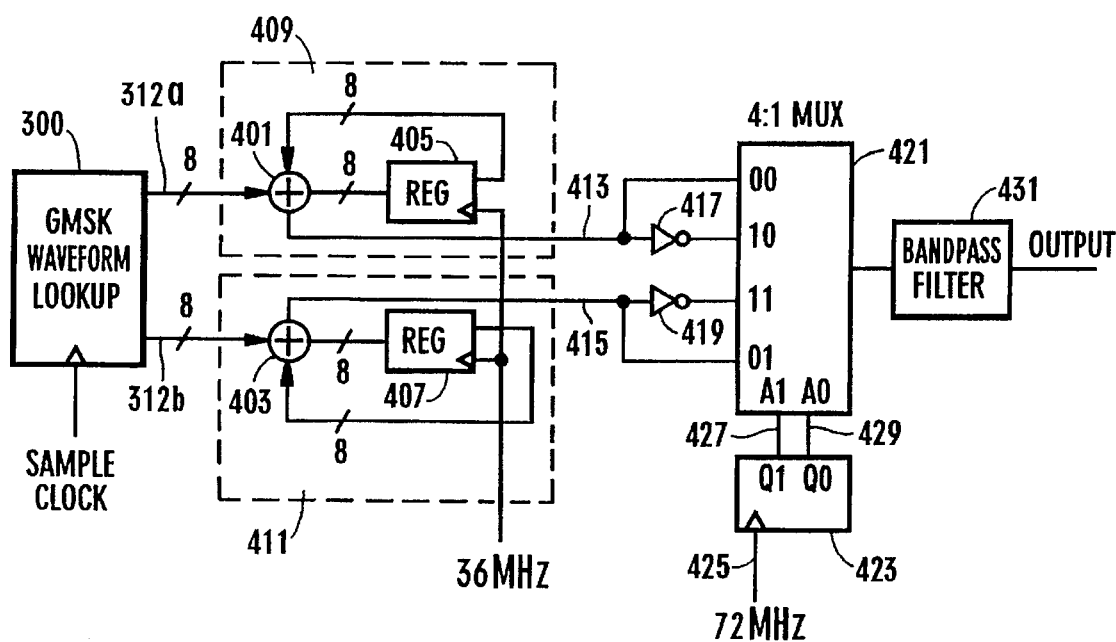
FIG. 2 is a simplified block diagram of a modulator and upconverter in accordance with one embodiment of the present invention.
Figure 3:
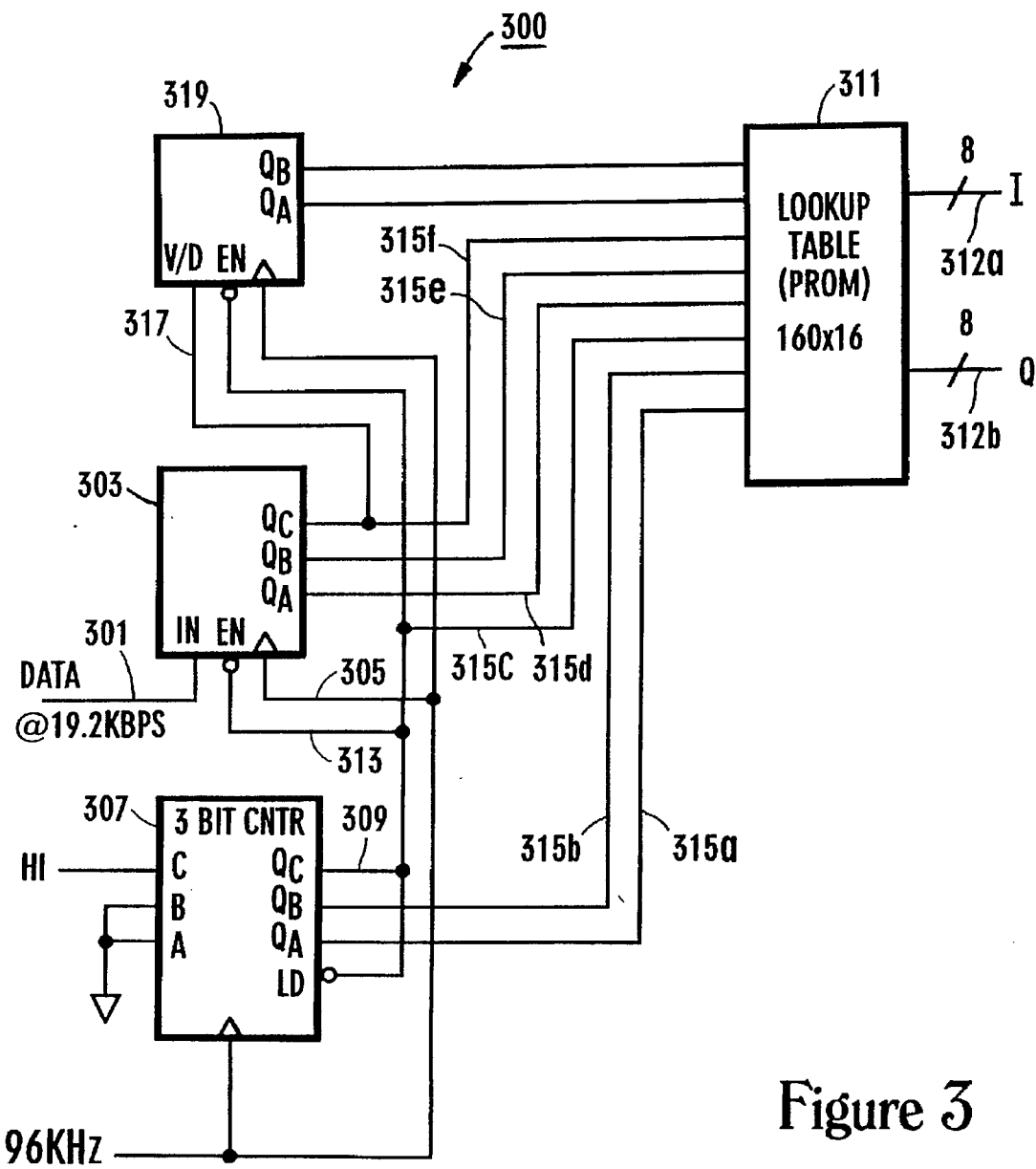
FIG. 3 is a simplified block diagram of a modulator in accordance with one embodiment of the present invention.

FIG. 2 is a simplified block diagram of a digital phase modulator and IF upconverter in accordance with one embodiment of the present invention. FIG. 2 illustrates the present invention for use with a cellular digital packet data (CDPD) remote unit which modulates the information to be communicated by Gaussian-shaped Minimum Shift Keying (GMSK) modulation techniques. It should be understood that the present invention may be implemented with any modulation scheme that can be represented at baseband by its in-phase and quadrature components. For example, while the present invention is shown here in the context of a GMSK modulator, a BPSK, QPSK, MPSK or any other such phase modulation scheme may be used. A number of modulation techniques which are appropriate for use with the present invention are well known in the art. For example, FIG. 3 is a simplified block diagram which illustrates one method and apparatus for providing GMSK modulation. In accordance with the system shown in FIG. 2, the IF frequency is 90 MHz. The symbol rate from the GMSK modulator is 19.2 kbps (kilo-bit per second). In the example shown in FIG. 2, there are five samples per bit. Accordingly, a sample clock operates at 96 kHz. In the example shown in FIG. 2, the sample rate has been chosen to be compatible with the rate of other clock used within the system, as will become apparent from the following discussion.

Referring first to FIG. 3, a GMSK modulator shown in the example of FIG. 2 is provided in greater detail. In FIG. 3, an input data signal is coupled via signal line 301 to the serial input of a three-bit shift register 303. The clock input to the shift register 303 is coupled to the sample clock operating at 96 kHz via signal line 305. The sample clock is also coupled to the clock input to a 3-bit counter 307. As shown in FIG. 3, the counter 307 has a load input which is coupled to the most significant of the three outputs via signal line 309. The load input is shown to be active low. Therefore, each time the most significant bit of the counter 307 transitions to a low logic level, the counter is preset to a value that is determined by three preset inputs which are shown to be low for the two least significant bits and high for the most significant bit. It should be understood that either positive or negative logic and other counter schemes that provide the same repetition rate as the configuration shown may be used. The counter 307 is preset to a count value equal to 4 each time the counter rolls over to zero. The 3-bit output from the counter 307 is coupled via signal lines 315a, 315b, 315c to the least significant three address inputs to a lookup table programmable read only memory (PROM) 311. For each cycle of the sample clock, the PROM 311 provides one 8-bit digital sample of an in-phase component and one 8-bit digital sample of a quadrature component of a GMSK modulated baseband signal via signal lines 312a, 312b. Accordingly, the addresses to the PROM 311 change at the sample rate of 96 kHz (5 samples per input data bit) such that five samples are output for each symbol. The most significant output bit from the counter 307 is also coupled to an enable input to the shift register 303 via signal line 313. Accordingly, the data input bits are entered into and shifted within the shift register 303 at the data input rate of 96 kHz/5=19.2 kHz. The parallel output from the shift register 303 is coupled to three address inputs to the PROM 311 via signal lines 315d, 315e, 315f. The oldest bit within the shift register 303 is coupled via signal line 317 to the up/down control of a 2-bit counter 319. The 2-bit counter 319 has the effect of adding multiples of 90 degrees to the 8-bit digital representation of the in-phase and quadrature output signal provided at the output of the PROM 311. Therefore, when the oldest bit in the shift register is a logical one, the counter 319 increments the phase by 90 degrees. Alternatively, when the oldest bit in the shift register 303 is a logical zero, the counter 319 decrements the phase by 90 degrees. In an alternative embodiment, selectively exchanging and/or inverting the in-phase and quadrature components of the signal based on the state of the 2 bit counter 319 effectively rotates the in-phase and quadrature components by multiples of 90 degrees.

It should be noted that the modulation scheme may be performed by any hardware or software which is capable of providing a digital in-phase and quadrature sample representation of the modulated baseband signal. For example, a digital signal processor (DSP) may be used to save hardware. Once per symbol the firmware can look up five in-phase and five quadrature samples and write them to a simple FIFO (first-in/first-out memory) or ASIC (application specific integrated circuit). The ASIC can then read the samples from the FIFO at the sample rate. Other modulation schemes may be performed in known fashion to yield the desired digital representation of the in-phase and quadrature samples.

Referring back now to FIG. 2, the samples output from the modulator waveform lookup 300 are coupled via the signal lines 312a, 312b to an in-phase Delta-sigma Data Converter (DDC) 409 and a quadrature DDC 411. These DDCs 409, 411 increase the number of samples per second used to digitally represent the in-phase and quadrature signals while reducing the number of bits used to represent each sample to a single bit for each signal. The spectrum of the resulting signal reproduces the desired signal near baseband, but includes a substantial amount of quantization noise power that is concentrated at frequencies away from the baseband frequency. This noise can be removed using a filter, such as an analog filter, to yield the desired signal. Thus, the DDCs 409, 411 perform the function normally achieved using a conventional, and more complex, digital-to-analog converter.

The spectral shape of the quantization noise present in the output is determined by the exact implementation of the DDCs 409, 411. In the embodiment shown in FIG. 2, a first order DDC is implemented for each of the modulator signals using a single 8-bit adder and an 8-bit register. The output from each adder 401, 403 is preferably nine bits wide (i.e., eight bits plus a carry). The output of each adder 401, 403, excluding the carry bit, is coupled to a register, such as an eight bit register in the case of the embodiment shown in FIG. 2, in which eight bits of each adder 401, 403 are coupled to a corresponding 8-bit register 405, 407. In the embodiment shown in FIG. 2, each 8-bit register 405, 407 is clocked at a rate of 36 MHz. The clock frequency in the preferred embodiment has been chosen to be an integer multiple of the 96 kHz sample rate to make it possible to use only one clock source in the design. However, in alternative embodiments, the clock rate of the DDCs 409 and 411 are not related by an integer multiple to the sample rate. Nonetheless, the DDC clock rate should exceed the sample rate by an amount great enough to provide acceptable quantization noise performance and to provide the desired output signal carrier frequency as described below. The combination of an 8-bit digital adder and a register coupled together as shown in FIG. 2 comprises a single-bit DDC 409, 411, in which the duty cycle of the 36 MHz output provides an average output voltage that is directly proportional to the voltage represented by the eight bit input provided to the adders 401, 403. The output from each DDC 409, 411 is the carry output coupled via signal lines 413, 415 to either an inverter 417, 419 or directly to a 4:1 multiplexer 421. The four inputs to the 4:1 multiplexer 421 are coupled to the non-inverted output from the in-phase DDC 409, the inverted output from the in-phase DDC 409, the non-inverted output from the quadrature DDC 411, and the inverted output from the quadrature DDC 411. It will be understood by those of ordinary skill in the art that the single-bit DDCs of the present invention may be designed using any known architecture.

A 2-bit counter 423 is incremented by a 72 MHz clock coupled to the clock input of the counter 423 on signal line 425. The outputs from the counter 423 are coupled to the select inputs of the multiplexer via signal lines 427, 429. The combination of the inverters 413, 415 and the 4:1 multiplexer 421 acts as an upconverter. That is, by cycling through the four inputs to the 4:1 multiplexer 421 at a rate of 72 MHz, the output from the multiplexer 421 is a signal that has a carrier frequency equal to ¼ of the clock rate of the counter 423. Thus, the multiplexer produces a sequence of samples that have the form $\cos(\phi(t))$, $-\sin(\phi(t))$, $-\cos(\phi(t))$, $\sin(\phi(t))$, which is equivalent to modulating the samples with a carrier that rotates a full cycle at ¼ of the clock rate, which in the example shown is 72 MHz/4. It will be understood by those skilled in the art that other frequencies may be used to clock the 4:1 multiplexer 421, and that any multiplexing device that is capable of selecting each one of the four inputs in sequence may be used as a multiplexer. Furthermore, the sequence of samples having the form $\cos(\phi(t))$, $\sin(\phi(f))$, $-\cos(\phi(t))$, $-\sin(\phi(t))$ has a comparable effect, since this effectively rotates the carrier in the opposite direction.

In one embodiment of the present invention in which the output from the modulator and upconverter are to be used in a CDPD remote unit having an IF frequency of 90 MHz, the clock frequencies shown in FIGS. 2 and 3 would be appropriate. It should be understood that in other applications of the present invention, it may be desirable to use other clock rates and sample rates. However, in the example shown in FIG. 2 and 3, the rate of 72 MHz is selected because an image of the sampling process is generated 18 MHz above the fundamental. Accordingly, 72 MHz+18 MHz=90 MHz. Because the signal is generated using sampled processes, there are also aliases of the signal centered at frequencies that are multiples of the 72 MHz sample frequency of the multiplexer and at multiples of the 96 kHz sample frequency of the modulator. In many applications these aliases must be suppressed to a level of as much as −60 dBc or more. Thus a bandpass filter 431 is required to suppress the alias energy present in the output of the multiplexer 421. There are many inexpensive, small and commonly available filters (e.g. crystal filters or surface acoustic wave (SAW) filters) that can provide the required attenuation to remove the unwanted alias energy.

It can be seen that by using a simple digital circuit in which no clock rates greater than 72 MHz are required, a modulated analog output signal at an IF frequency of 90 MHz is generated. Because of the simple digital components used in the present invention, the present invention can be easily fabricated on an integrated circuit such as an ASIC. Furthermore, because of the simplicity of the design, the present invention requires relatively little space or power. Therefore, the present invention is ideally suited for use in mobile communications equipment, such as cellular phones.

It should be noted that the frequencies selected for the clock to the counter 423 is an even multiple of the sample clock to the counter 307. Accordingly, by providing a sample rate that is equal to five times the symbol rate, the same base frequency can be used to generate both the sample clock used in the modulator and the clocks coupled to the registers 405, 407 and counter 423. Such an integer relationship is not always convenient and alternative embodiments of the present invention are possible in which such a relationship does not exist. Nonetheless, this embodiment is shown as an example of a very efficient implementation of the present invention.

SUMMARY

A number of embodiments of the present invention have been described. Nevertheless, it will be understood that various modifications may be made without departing from the spirit and scope of the invention. For example, any modulation techniques which provide a digital output representative of an in-phase component and a quadrature component (such as BPSK, MPSK, QPSK, etc.) are within the scope of the present invention. Furthermore, the particular clock frequencies used as the sample clock, the input clock to the DDCs and the input clock to the counter which controls the output multiplexer may be chosen as appropriate to achieve the desired IF frequency and number of samples per symbol. Decreasing the number of samples per symbol reduces processor loading and look-up table memory requirements in the modulator, but moves aliases in the output of multiplexer 421 closer to the desired signal, thus increasing the rejection requirements on the bandpass filter 431. Decreasing the clock rate of the DDCs 409 and 411 increases quantization noise present in the output signal. For example, assuming that an adequate bandpass filter is available, it is quite acceptable to have a sample rate of 76.8 kHz (i.e. 4 samples per symbol) for a symbol rate of 19.2 kbps. The rate of 96 kHz is used in the example provided in FIGS. 2 and 3 only in order to illustrate that all of the clocks used in the present invention can be related to a base frequency and thus each clock may be generated from a single source.

Still further, the example of the embodiment provided above illustrates the present invention with a 4:1 multiplexer having two select lines which are coupled to a 2-bit counter incremented by a clock. It will be understood by those of ordinary skill in the art that there are numerous ways in which this multiplexing function may be performed. For example, the inversions may be provided by a programmable inverter, such as an exclusive or gate or programmable device. Therefore, the same input line may be selected by a two input multiplexer for two clock cycles (or the clock run at half the speed shown). The input signal to the programmable inverter is then inverted upon command to the programmable inverter. Furthermore, the multiplexer may be such that a clock signal input to the multiplexer causes the multiplexer to cyclically select each of the four inputs in a "round robbin" fashion without the need for the 2-bit counter. Furthermore, each register of the DDC may be any device which is capable of delaying an input signal for a predetermined amount of time in order to cause the input to the digital adder circuit to be applied one time period after the output is provided therefrom. Accordingly, it is to be understood that the invention is not to be limited by the specific illustrated embodiment, but only by the scope of the appended claims.

I claim:

1. A digital upconverter/modulator including:
   (a) a digital modulator having an in-phase and quadrature digital output;
   (b) a first single-bit resolution delta-sigma data converter, coupled to the in-phase digital output, having an output with one digital bit of resolution;
   (c) a second single-bit resolution delta-sigma data converter, coupled to the quadrature digital output, having an output with one digital bit of resolution;
   (d) a first inverter coupled to the output from the first single-bit resolution delta-sigma data converter;
   (e) a second inverter coupled to the output from the second single-bit resolution delta-sigma data converter; and
   (f) a multiplexer, coupled to the first and second inverters, and to the output of the first and second single-bit resolution delta-sigma data converters, the multiplexer having an output that is selectively coupled to any one of the multiplexer inputs.

2. The digital upconverter/modulator of claim 1, wherein the digital modulator is a GMSK modulator.

3. A digital upconverter/modulator, including:
   (a) a first single-bit delta-sigma data converter, including:
      (1) an input configured for receiving an in-phase digital output from a digital modulator; and
      (2) an output with one digital bit of resolution;
   (b) a second single-bit delta-sigma data converter, including:
      (1) an input configured for receiving a quadrature digital output from the digital modulator; and
      (2) an output with one digital bit of resolution;
   (c) a first inverter coupled to the output from the first delta-sigma data converter;
   (d) a second inverter coupled to the output from the second delta-sigma data converter; and
   (e) a multiplexer, having four inputs, the first input being coupled to the first inverter the second input being coupled to the second inverter, the third input being coupled to the first single-bit delta sigma data converter, and the fourth input being coupled to the output from the second delta-sigma data converter, the multiplexer also having an output selectively coupled to the non-inverted and inverted outputs of the first and second delta-sigma data converters.

4. The digital upconverter/modulator of claim 3, wherein the first delta-sigma data converter includes a first register and the second delta-sigma data converter includes a second register, the first and second registers each including a register clock input, and wherein the digital upconverter/modulator further includes at least one clock having an output, one of the clock outputs being coupled to each of the register clock inputs.

5. The digital upconverter/modulator of claim 4, wherein the clock coupled to the register inputs runs at approximately 36 MHz.

6. The digital upconverter/modulator of claim 4 wherein the multiplexer has a selector input, the digital upconverter/modulator further including a counter having a counter clock input, the counter clock input being coupled to one of the clock outputs.

7. The digital upconverter/modulator of claim 6, wherein the clock coupled to the counter runs at approximately 72 MHz.

8. The digital upconverter/modulator of claim 6, further including a master clock from which each other clock is derived.

9. The digital upconverter/modulator of claim 3, wherein the first delta-sigma data converter includes:
   (a) a digital adder having:
      (1) a first adder input, coupled to the first input to the delta-sigma data converter;
      (2) a second adder input;
      (3) a first adder output, coupled to the output of the delta-sigma data converter:
      (4) a second adder output; and
   (b) a first register having:
      (1) a register input, coupled to the first adder output, and
      (2) a register output, coupled to the second adder input;
   and wherein the second delta-sigma data converter includes:
   (c) a digital adder having:
      (1) a first adder input, coupled to the first input to the delta-sigma data converter;
      (2) a second adder input;
      (3) a first adder output, coupled to the output of the delta-sigma data converter;

(4) a second adder output; and
(d) a first register having:
  (1) a register input, coupled to the first adder output, and
  (2) a register output, coupled to the second adder input.

10. The digital upconverter/modulator of claim 3, further including a bandpass filter coupled to the output of the multiplexer.

* * * * *